US009362163B2

(12) United States Patent
Danek et al.

(10) Patent No.: US 9,362,163 B2
(45) Date of Patent: Jun. 7, 2016

(54) METHODS AND APPARATUSES FOR ATOMIC LAYER CLEANING OF CONTACTS AND VIAS

(71) Applicant: Lam Research Corporation, Fremont, CA (US)

(72) Inventors: Michal Danek, Cupertino, CA (US); Juwen Gao, San Jose, CA (US); Aaron Fellis, San Jose, CA (US); Francisco Juarez, Fremont, CA (US); Chiukin Steven Lai, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/446,203

(22) Filed: Jul. 29, 2014

(65) Prior Publication Data
US 2015/0037972 A1 Feb. 5, 2015

Related U.S. Application Data

(60) Provisional application No. 61/860,167, filed on Jul. 30, 2013.

(51) Int. Cl.
| H01L 21/02 | (2006.01) |
|---|---|
| H01L 21/768 | (2006.01) |
| C23G 5/00 | (2006.01) |

(52) U.S. Cl.
CPC ........... *H01L 21/76841* (2013.01); *C23G 5/00* (2013.01); *H01L 21/02063* (2013.01); *H01L 21/76814* (2013.01)

(58) Field of Classification Search
CPC ........................................................ C23F 4/00
See application file for complete search history.

(56) References Cited

U.S. PATENT DOCUMENTS

| 5,482,802 A * | 1/1996 | Celler et al. ...................... 430/5 |
|---|---|---|
| 6,635,965 B1 | 10/2003 | Lee et al. |
| 6,844,258 B1 | 1/2005 | Fair et al. |

(Continued)

OTHER PUBLICATIONS

Oehrlein, Gottlieb S., "Atomic Layer Etching of SiO2: Challenges and Opportunities," University of Maryland, Atomic Layer Etch and Atomic Layer Clean Technology Workshop, San Francisco, Apr. 21, 2014, 22 pages.

(Continued)

*Primary Examiner* — Nicole Blan
(74) *Attorney, Agent, or Firm* — Weaver Austin Villeneuve & Sampson LLP

(57) ABSTRACT

Described are cleaning methods for removing contaminants from an electrical contact interface of a partially fabricated semiconductor substrate. The methods may include introducing a halogen-containing species into a processing chamber, and forming an adsorption-limited layer, which includes halogen from the halogen-containing species, atop the electrical contact interface and/or the contaminants thereon. The methods may further include thereafter removing un-adsorbed halogen-containing species from the processing chamber and activating a reaction between the halogen of the adsorption-limited layer and the contaminants present on the electrical contact interface. The reaction may then result in the removal of at least a portion of the contaminants from the electrical contact interface. In some embodiments, the halogen adsorbed onto the surface and reacted may be fluorine. Also described herein are apparatuses having controllers for implementing such electrical contact interface cleaning techniques.

17 Claims, 6 Drawing Sheets

(56) References Cited

U.S. PATENT DOCUMENTS

| | | |
|---|---|---|
| 7,005,372 B2 | 2/2006 | Levy et al. |
| 7,141,494 B2 | 11/2006 | Lee et al. |
| 7,416,989 B1 * | 8/2008 | Liu et al. ........................ 438/706 |
| 7,589,017 B2 | 9/2009 | Chan et al. |
| 7,772,114 B2 | 8/2010 | Chan et al. |
| 7,955,972 B2 | 6/2011 | Chan et al. |
| 8,048,805 B2 | 11/2011 | Chan et al. |
| 8,058,170 B2 | 11/2011 | Chandrashekar et al. |
| 8,124,531 B2 | 2/2012 | Chandrashekar et al. |
| 8,551,885 B2 | 10/2013 | Chen et al. |
| 8,808,561 B2 | 8/2014 | Kanarik |
| 8,883,028 B2 | 11/2014 | Kanarik |
| 2006/0051959 A1 * | 3/2006 | Iwatake et al. ................. 438/643 |
| 2010/0291751 A1 * | 11/2010 | Lee et al. ....................... 438/435 |
| 2011/0151635 A1 * | 6/2011 | Liu et al. ........................ 438/301 |
| 2011/0192820 A1 * | 8/2011 | Yeom et al. ..................... 216/67 |

OTHER PUBLICATIONS

Metzler, Dominik, et al., "Fluorocarbon assisted atomic layer etching of SiO2 using cyclic Ar/C4F8 plasma," Journal of Vacuum Science & Technology A, vol. 32, No. 2, Mar./Apr. 2014, 5 pages.

Kim, Jong Kyu, et al., "Atomic layer etching removal of damaged layers in a contact hole for low sheet resistance," Journal of Vacuum Science & Technology, vol. 31, No. 6, Nov./Dec. 2013, 8 pages.

\* cited by examiner

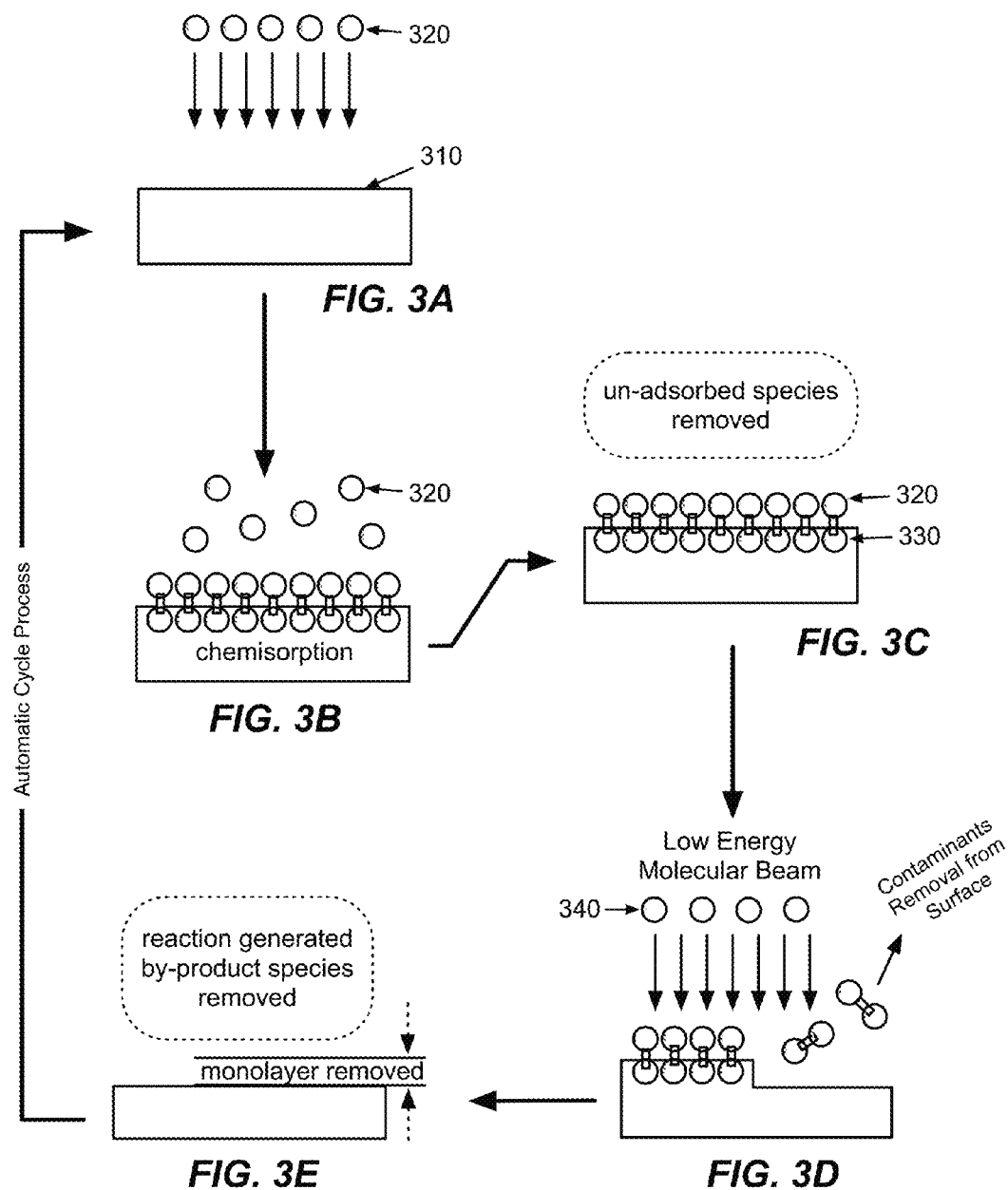

US 9,362,163 B2

METHODS AND APPARATUSES FOR ATOMIC LAYER CLEANING OF CONTACTS AND VIAS

CROSS-REFERENCE TO RELATED APPLICATION

This application claims priority to U.S. Provisional Patent Application No. 61/860,167, filed Jul. 30, 2013, and titled "METHODS AND APPARATUSES FOR ATOMIC LAYER CLEANING OF CONTACTS AND VIAS," which is hereby incorporated by reference in its entirety and for all purposes.

BACKGROUND

In integrated circuit (IC) manufacturing, electronic devices fabricated on a semiconductor substrate (transistors, for example) typically require the formation of electrical connections between one another in order to form the desired final operational IC device. This connection process is generally referred to as "metallization," and it may be performed using a number of photolithographic patterning, etching, and deposition techniques and steps. Typically, metallization results in the filling with one or more conductive materials of the various interconnect structures formed in the surface of a semiconductor substrate, which after fill may then function as electrical pathways to interconnect the various circuit devices on the substrate. For example, tungsten, copper, and/or other conductive materials may be used for filling horizontal interconnects, vias between adjacent metal layers, contacts between first metal layers and devices on the silicon substrate, and may generally be used for filling various high aspect ratio features utilized in IC design.

SUMMARY

Disclosed herein are cleaning methods for removing contaminants from an electrical contact interface of a partially fabricated semiconductor substrate. The electrical contact interface may be used for making an electrical connection with metal deposited in a subsequent fabrication operation. The methods may include introducing a halogen-containing species into a processing chamber, and forming an adsorption-limited layer, which includes halogen from the halogen-containing species, atop the electrical contact interface and/or the contaminants thereon. The methods may further include thereafter removing un-adsorbed halogen-containing species from the processing chamber and activating a reaction between the halogen of the adsorption-limited layer and the contaminants present on the electrical contact interface. The reaction may then result in the removal of at least a portion of the contaminants from the electrical contact interface. In some embodiments, the methods may further include removing halogen-containing species generated by the reaction. In some embodiments, the halogen adsorbed onto the surface and reacted may be fluorine. In some embodiments, the contaminants may include one or more fluorocarbon polymer species deposited in a prior fabrication operation involving a reactive ion etch of the partially-manufactured semiconductor substrate. In some embodiments, activating the reaction may include reacting an additional chemical species with the halogen and/or halogen-containing species of the adsorption-limited layer. In some embodiments, activating the reaction may include providing thermal energy to the adsorption-limited layer. In some embodiments, activating the reaction may include exposing the adsorption-limited layer to an ion and/or free-radical species of a plasma.

Also disclosed herein are apparatuses for forming a metallization layer in electrical contact with an electrical contact interface of a partially fabricated semiconductor substrate. The apparatuses may include a processing chamber, a substrate holder within the processing chamber, one or more gas inlets for introducing chemical species into the processing chamber, and an exhaust system for evacuating chemical species from the processing chamber. The apparatuses may further include a controller having machine-readable instructions which the controller is configured to execute. Depending on the embodiment, the instructions may include instructions for operating the one or more gas inlets to introduce a halogen-containing species into the processing chamber. The instructions of the controller may further include instructions for maintaining conditions within the processing chamber such that an adsorption-limited layer forms atop the electrical contact interface and/or contaminants thereon, the adsorption-limited layer including fluorine from the fluorine-containing species. The instructions of the controller may further include instructions for operating the exhaust system to remove un-adsorbed fluorine-containing species from the processing chamber, instructions for activating a reaction between the fluorine of the adsorption-limited layer and the contaminants present on the electrical contact interface—the reaction resulting in the removal of at least a portion of the contaminants from the electrical contact interface, instructions for operating the one or more gas inlets to introduce a metal-containing species into the processing chamber, and instructions for maintaining conditions within the processing chamber such that metal of the metal-containing species is deposited onto the electrical contact interface forming the metallization layer. In some embodiments, apparatuses may further include a plasma generator for generating a plasma within the processing chamber. In certain such embodiments, the instructions of the controller for activating the reaction may then further include instructions for operating the plasma generator to generate a plasma within the processing chamber and thereby expose the adsorption limited layer to an ion and/or free-radical species present in the plasma.

BRIEF DESCRIPTION OF THE DRAWINGS

FIGS. 3A-3E schematically illustrate an atomic layer clean process for removing contaminants from the electrical contact interface of a semiconductor substrate.

DETAILED DESCRIPTION

In the following description, numerous specific details are set forth in order to provide a thorough understanding of the present invention. The present invention may be practiced without some or all of these specific details. In other instances, well known process operations have not been described in detail so as to not unnecessarily obscure the present invention. While the invention will be described in conjunction with specific detailed embodiments, it is to be understood that these specific detailed embodiments are not intended to limit the scope of the inventive concepts disclosed herein.

As described above, in IC fabrication, a "metallization" process may be performed to establish electrical connections between the various IC devices present on a partially fabricated semiconductor substrate. In order to do so, the conductive material deposited during metallization—the "contact metal"—should establish successful ohmic contact with the material on which it is deposited—the "contact substrate." This may be the silicon, silicon germanium, or germanium substrate, or it may be a layer formed atop the substrate to facilitate electrical connection, such as, for example, a layer of titanium silicide (germanide), silicidenickel silicide (germanide), cobalt silicide (germanide), tungsten, or the like. Such intermediate layers may facilitate electrical contact between the contact metal and the underlying substrate because, in some embodiments, a direct metal to semiconductor contact can be highly resistive. Other possible substrates may include GaAs and InGaAs, depending on the embodiment.

However, it is often found that prior to deposition of the contact metal, the top layer of the contact substrate may accumulate a layer of contaminants comprising a complex mixture of substances, the presence of which may inhibit or prevent successful ohmic connection between it and the deposited contact metal. In particular, reactive ion etch (RIE) techniques, which may be used to open the contact area of the substrate, oftentimes result in the deposition of etch residues on the contact area which may include substrate oxide, carbon polymers containing F, N, H and O; metal oxides; metal fluorides; metal silicates; and the like. In addition, post-etch exposure to the atmosphere results in the formation of native $SiO_2$ which also contaminates the surface of the electrical contact interface and inhibiting good ohmic contact. Note that the term "contaminants" as used herein with respect to an electrical contact interface refers to any of the foregoing species which may accumulate on the electrical contact interface. Thus, potential classes of compounds which make up the contaminants to be removed by the atomic layer cleaning (ALC) techniques disclosed herein may include, but are not limited to oxygen, carbon, nitrogen, silicate, as well as fluorine containing compounds, fluorinated carbon compounds, etc., and also silicon oxides.

Figure 1B:
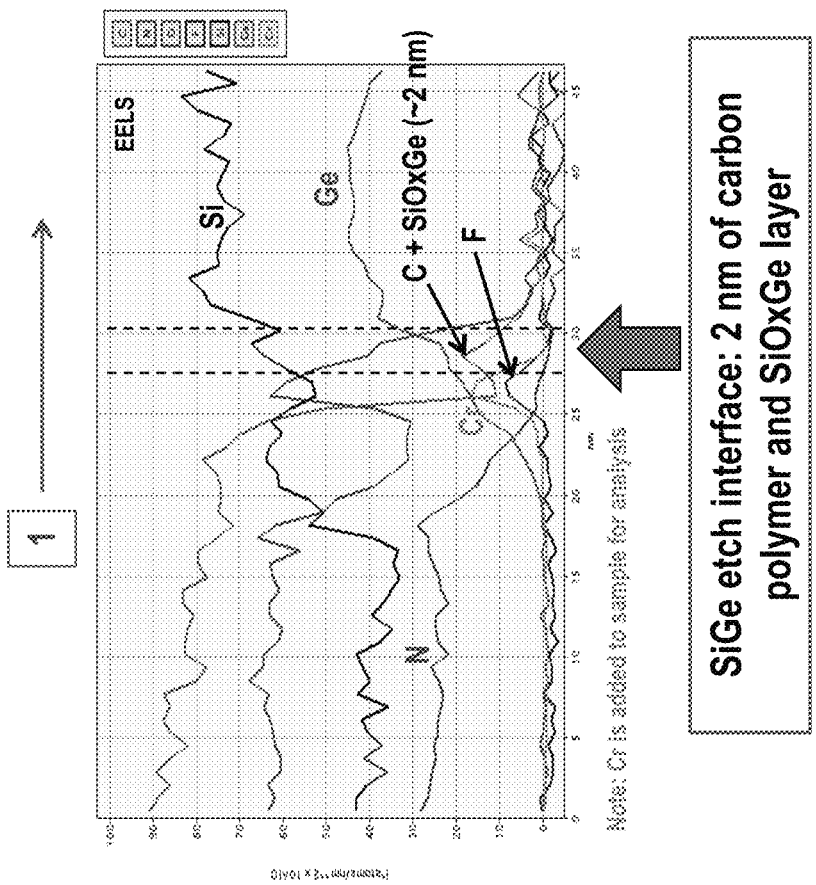
FIGS. 1A-1B present a schematic cross-section and compositional analysis of a FinFET SiGe substrate having been contaminated from a reactive ion etch process.
Figure 1A:
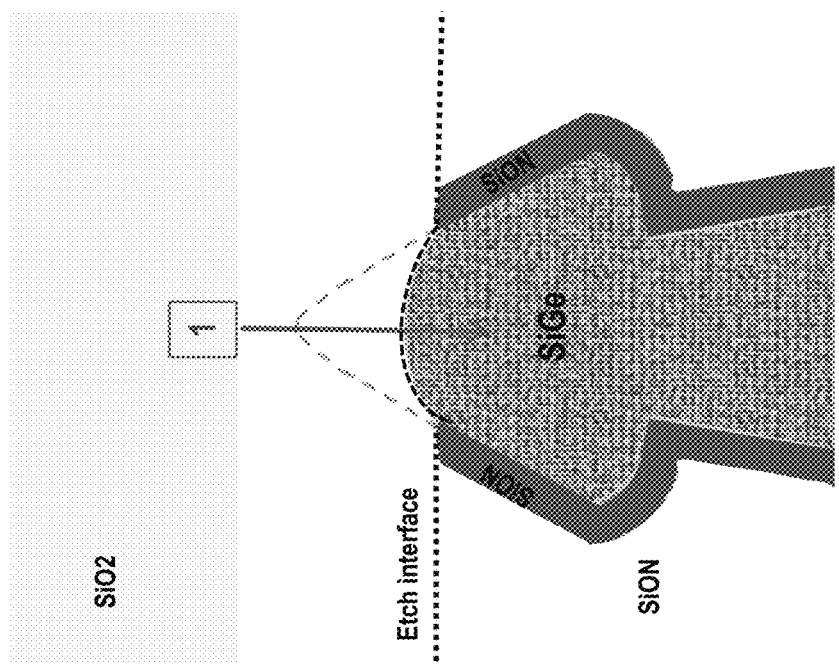

One schematic example of a SiGe FinFET contact substrate where such contamination has occurred is displayed cross-sectionally in FIG. 1. FIG. 1A is a schematic cross-section of a FinFET contact substrate. FIG. 1B shows EELS measurements of the contact substrate's composition moving down the cross-section as shown by the arrow adjacent to the boxed numeral 1. As shown in the figure, the top of the SiGe substrate is coated with a 2 nm film of post contact open SiGe oxide and carbon residue. The figure also shows that some fluorine signature is also documented in this 2 nm interfacial layer of contamination.

Figures 2A, 2B:
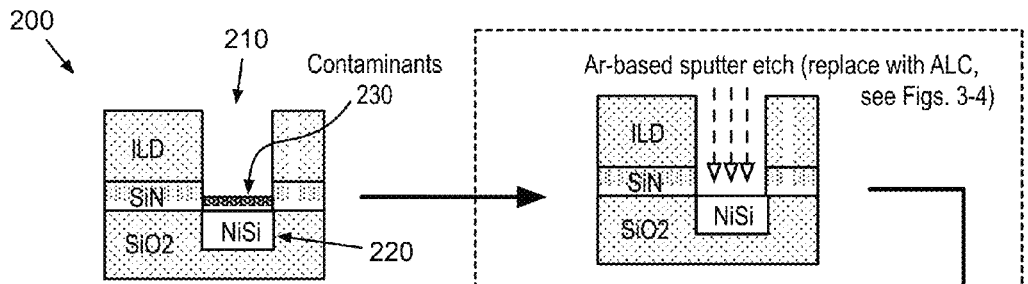
FIGS. 2A-2E schematically illustrate a tungsten metallization process employing a sputter etch technique for cleaning the electrical contact interface within a feature of a silicon substrate.
Figure 2C:
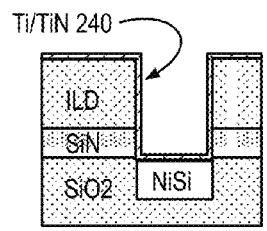
Figures 2D, 2E:
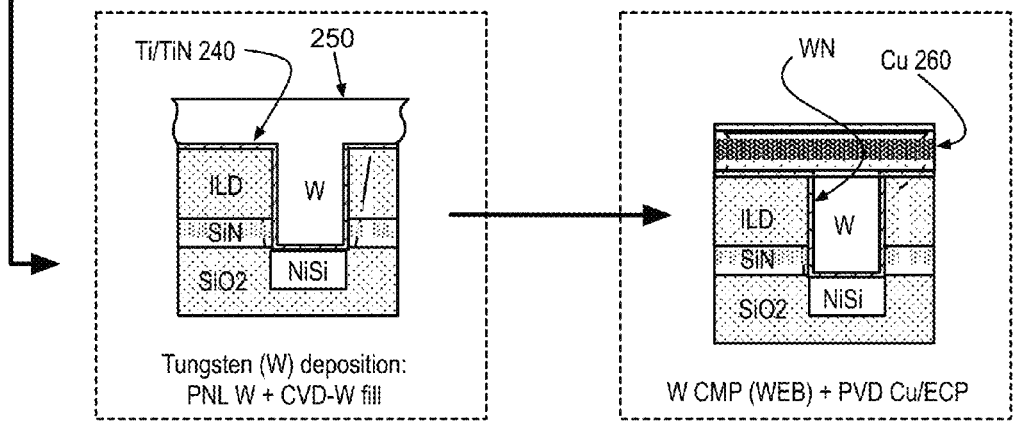

To deal with the removal of contaminants from the surface of a contact substrate so that it can make proper ohmic contact with the contact metal deposited during metallization processes, a sputter etch may be employed, in some cases, in conjunction with a wet chemical clean. For example, FIGS. 2A-2E schematically illustrates one example of a tungsten metallization process which employs a sputter etch cleaning technique as part of a process for filing a feature formed in the surface of a substrate 200. The feature 210 could be a trench or via structure or any other structure where an electrical connection is desired. In this case, a silicide layer 220 is present at the base of the feature 210 and, as shown in the FIG. 2A, it is covered with contaminants 230 which are removed by an Ar-based sputter etch as shown in FIG. 2B. Once the contaminants 230 are cleaned away or removed, the surface of the silicide layer 220 is exposed and ready to make good electrical contact with a layer of deposited metal. However, before this is done, as shown in FIG. 2C, an "integrated liner" of elemental titanium and/or titanium nitride (for example, deposited via PVD ("physical vapor deposition") or CVD ("chemical vapor deposition")) is formed over the surface of the feature 210 (including bottom and sidewalls) to serve as a barrier or protection layer 240. With this barrier layer 240 in place, tungsten (W) is finally deposited to fill the feature as shown in FIG. 2D and, with the silicide layer 220 serving as an intermediary with its exposed surface cleaned of contaminants, the deposited tungsten 250 may achieve good ohmic contact with the underlying contact substrate 200. Note that in some embodiments, the barrier layer may further include fluorine-free tungsten or Ti and flourine-free tungsten. In some embodiments, the depositing the tungsten metallization layer may include introducing a tungsten-containing species and molecular hydrogen into the processing chamber, and reacting the tungsten-containing species with the molecular hydrogen to deposit tungsten atop the cleaned electrical contact interface. See the discussion below relating to tungsten deposition techniques. This particular metallization embodiment is completed with planarizing the deposited tungsten with a chemical mechanical polish (CMP) followed by deposition of a copper layer 260 (via PVD of a Cu seed layer followed by electrochemical plating ("ECP") to deposit Cu in bulk), as shown in FIG. 2E.

The metallization process schematically illustrated in FIGS. 2A-2E utilizes a sputter etch technique to remove contaminants from the electrical contact surface of the displayed semiconductor feature. This sputter etch—schematically illustrated in FIG. 2B—generally, is a low pressure physical removal process involving bombardment of the substrate with ions of an inert gas, for example, such as argon (as indicated in FIG. 2B). While such sputter etch processes may generally work within a certain operation window, in practice the operational window for minimizing substrate damage and protecting the critical dimension (CD) and aspect ratio (AR) of the contact is often quite narrow—especially as the CD of IC devices scales down below 20 nm. Due to such a narrow operational window, there is a need for an improved contact cleaning process which can be incorporated into, for example, the metallization procedure outlined in FIGS. 2A-2E, and can be used to selectively and effectively remove etch contaminants (e.g., residues from a reactive ion etch (RIE)) from the contact substrate without damaging the semiconductor substrate and without substantially changing the CD or AR of the contact region.

Accordingly, disclosed herein are cleaning techniques, operations, methodologies, etc. for removing contaminants from an electrical contact interface of a partially fabricated semiconductor substrate which are more selective than the argon sputter etch technique and which, in some embodiments, are much less damaging to the electrical contact feature being cleaned. In some embodiments, the cleaning techniques may employ a process akin to atomic layer deposition (ALD), where a surface reaction, in this case a cleaning reaction, may be controlled with atomic layer precision, thereby causing the cleaning reaction to occur at the electrical contact surface while not substantially taking place on the sidewalls of the electrical contact feature being cleaned. Thus, cleaning methods disclosed herein may employ an ALD-like process for cleaning referred to herein as an "Atomic Layer Clean" (ALC). Such a process is illustrated by the schematic cross sections shown in FIGS. 3A-3E, and by the flowchart in FIG. 4.

As shown in FIG. 3A, in some embodiments, such a process may begin by introducing a chemical species used for cleaning 32—i.e., a cleaning reactant species—into a processing chamber in order that the cleaning species 320 be delivered to the surface of the substrate 310 (as indicated by the downward arrows in the figure). In some embodiments, the cleaning species may be a halogen-containing species, and in certain such embodiments, a fluorine-containing species such as $XeF_2$, $BrF_3$, $IF_5$, $ClF_3$, etc. In some embodiments, the cleaning species may be a halogen- and carbon-containing species such as fluorocarbons, for example, $C_4F_8$.

After its introduction into the processing chamber, the cleaning species 320 (or a portion of the cleaning species) adsorbs onto the surface of the electrical contact interface of the substrate 310 such that it forms an adsorption-limited layer atop the surface 310 (and/or atop contaminants thereon). Oftentimes this adsorption-limited layer may be described as a monolayer, roughly having a uniform thickness of a single adsorbed molecule. Where conditions are such that this is the case, monolayer formation is oftentimes a consequence of the chemisorption process requiring an exposed surface on which to adsorb—i.e., a single adsorbed atom or molecule at a given point on the surface prevents further adsorption at that point.

Such adsorption of a monolayer of cleaning species 320 onto the surface 310 to be cleaned is schematically illustrated in FIG. 3B. FIG. 3B schematically illustrates the cleaning species 320 binding directly to the contaminants 330 present on the surface of the substrate to be removed. (In some embodiments, the cleaning species may additionally possibly binding to the surface of the silicon substrate itself (or to its nickel silicide layer). While the cleaning methods disclosed herein are not limited to regimes where there is actual chemical bonding between cleaning species 320 and contaminants 330, in some cases chemical bonding, such as covalent bonding, may occur. In other cases, other forms of attractive interactions may exist between cleaning species and contaminants upon adsorption of the cleaning species onto the substrate surface.

The cleaning species and contaminants are portrayed in FIGS. 3A-3D as "balls" and their binding to each other as "sticks," yet it should be noted that each such species portrayal as a single "ball" should not be interpreted to imply that each such species are necessarily atomic species. Rather, the cleaning species and the contaminant species may be multi-atom molecular species as well, depending on the embodiment. The simple "ball-and-stick" drawings are used to provide a basic illustration of the surface adsorption process. It should also be noted that the adsorbed species may not constitute the complete cleaning species introduced into the processing chamber, despite the fact that FIGS. 3A-3B show, for sake of simplicity, the same species being introduced and subsequently adsorbed. In other words, in some embodiments, only a portion of the cleaning species may be adsorbed.

For instance, if the cleaning species introduced into the processing chamber is $XeF_2$, the adsorbed cleaning species may be atomic fluorine (F) radicals or fluorine atoms covalently bonded to chemical species of the contaminants present on the contact surface. Thus, in this example, it might be said that technically F is the species that does the cleaning. Nevertheless, for sake of clarity and simplicity, the cleaning species introduced into the processing chamber ($XeF_2$, in this example) and the species that is actually adsorbed (F in this example) both may be referred to herein as the "cleaning species," with the understanding that the phrase refers to a compound which is, or is the source of, the species which is actually adsorbed onto the surface and effectuates the cleaning as described herein.

It should also be noted that although FIG. 3B schematically illustrates adsorption of cleaning species onto a silicon, silicon germanium, germanium or nickel silicide surface at the bottom of an electrical contact feature (since the substrate surface in FIG. 3B is depicted horizontal), generally, the cleaning species may also be adsorbed onto the sidewalls of the contact feature. However, for the reasons described below, this doesn't necessarily result in the cleaning and potentially etching away of the sidewalls.

After adsorption has occurred, as shown in FIG. 3C, excess un-adsorbed (possibly including desorbed) cleaning species are removed from the processing chamber in order to prevent their interference with the activation and reaction of the chemisorbed species (e.g., potential concurrent gas-phase reaction) in subsequent steps of the cleaning process. In some embodiments, removal of excess un-adsorbed cleaning species may be accomplished by pumping un-adsorbed cleaning species out of the processing chamber. In some embodiments, removal may be accomplished by purging the processing chamber with an inert gas. In some embodiments, a combination sequence of pumping the reaction chamber down to a base pressure to remove un-adsorbed species and then purging, or vice versa, may be employed.

Once an adsorption-limited layer of the cleaning species is formed on the surface of the electrical contact and un-adsorbed precursor removed from the processing chamber, a reaction is activated between the adsorbed cleaning species and the contaminants present on the electrical contact interface. As shown in FIG. 3D, this results in the etching away of some of the surface and the removal of at least a portion of any contaminants present atop the underlying electrical contact interface. In some embodiments, as indicated above, the contaminants may include one or more interfacial layer species deposited in a prior fabrication operation involving a reactive ion etch of the partially-manufactured semiconductor substrate. FIG. 3C schematically illustrates the adsorption-limited layer being exposed to a low energy molecular/atomic beam 340 in order to activate the surface reaction, however, other reaction-activation techniques may be utilized as well. For instance, in some embodiments, the reaction may be activated by reacting an additional chemical species with the cleaning species (e.g., fluorine and/or fluorine-containing species) of the adsorption-limited layer. In other embodiments, the reaction may be thermally activated—i.e., thermally energy is provided to the adsorption-limited layer in order to cause the surface reaction.

Finally, in some embodiments, after the surface-mediated cleaning reaction has proceeded, by-product(s) generated by the cleaning reaction in FIG. 3D may be removed from the processing chamber as shown in FIG. 3E. In embodiments, where the adsorption limited layer contains fluorine as a cleaning species, the by-products may include fluorine-containing species.

Figure 4:
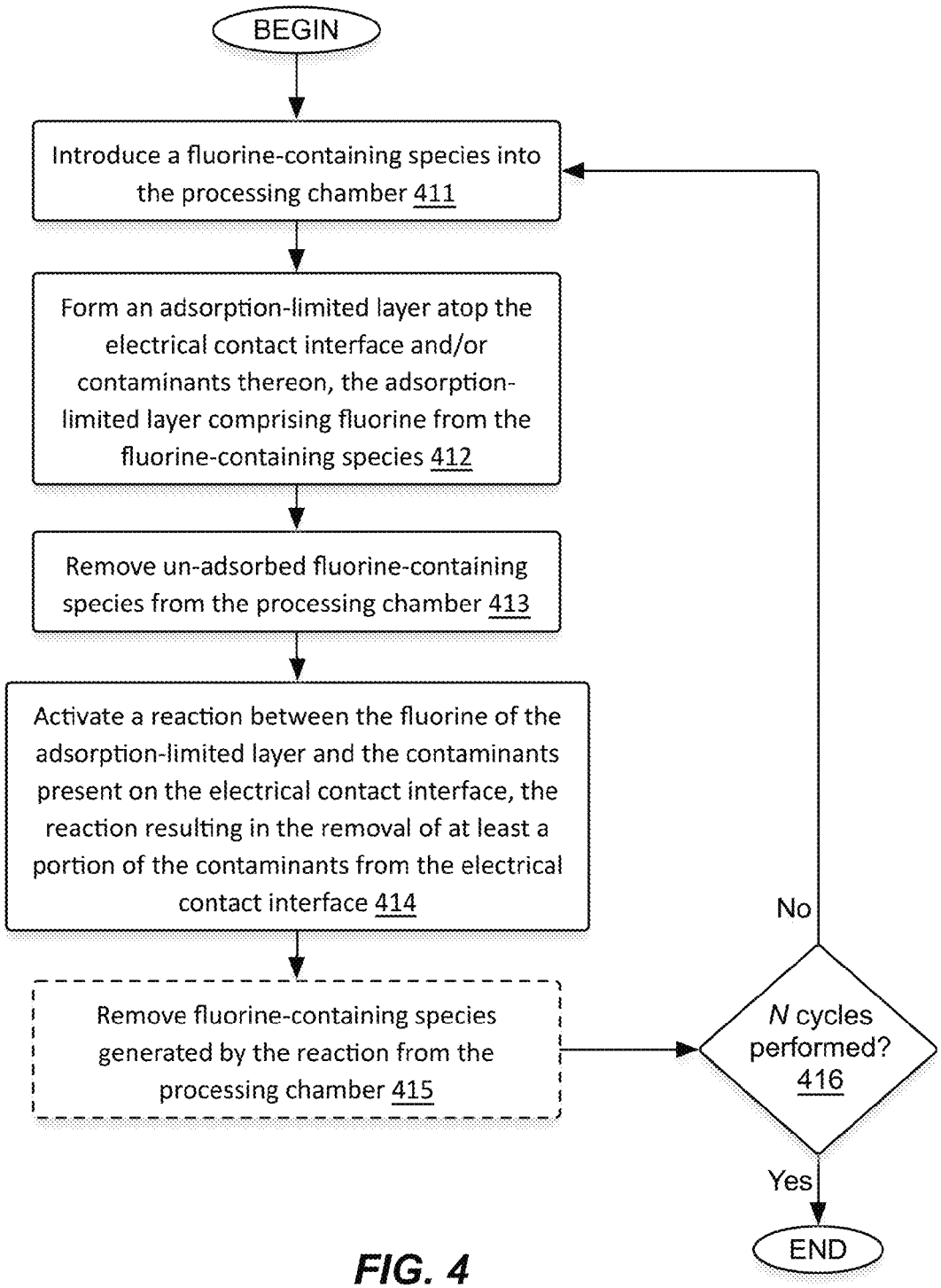
FIG. 4 is a flowchart of an atomic layer clean process for removing contaminants from the electrical contact interface of a semiconductor substrate.

FIGS. 3A-3E constitute one cycle of atomic layer clean (ALC). However, since each cycle only constitutes the reaction of a single adsorption-limited layer of cleaning species, typically only a single monolayer of contaminants are removed as shown in FIG. 3E, and so multiple cycles are typically performed in order to substantially clean an electrical contact interface coated a layer of contaminants of an appreciable thickness. Thus, this repetition of cleaning cycles is schematically indicated in the figures by the arrow joining FIG. 3E with FIG. 3A. Likewise, FIG. 4 provides a flowchart view of a cyclic ALC process, specifically in the context of employing a fluorine-containing cleaning species. As shown in the figure, the cyclic ALC process begins with the operation 411 of introducing a fluorine-containing species into the processing chamber, followed by operation 412 of forming an adsorption-limited layer atop the electrical contact interface and/or a contaminants thereon. In this embodiment, the adsorption-limited layer comprises fluorine from the fluorine-containing species. After the adsorption operation, the process continues by removing un-adsorbed fluorine-containing species from the processing chamber in operation 413. Finally, in operation 414, activation of a reaction between the fluorine of the adsorption-limited layer and the contaminants present on the electrical contact interface is accomplished. As stated in the flowchart, the reaction results in the removal of at least a portion of the contaminants from the electrical contact interface. Lastly, in some embodiments, there may be an additional operation 415 of removing fluorine-containing species generated by the reaction from the processing chamber. FIG. 4 then indicates that this ALC cycle may be repeated an arbitrary number, say N, times to accomplish a particular ALC process sequence. Thus, after activating the reaction in operation 414 and optionally removing reaction by-product in operation 415, the process proceeds to logic block 416 where it is determined whether N ALC cycles have been performed. If less than N cycles have been performed, the process proceeds to repeat operations 411-414 (and optionally 415) again. If N cycles have been performed, the process ends.

Referring again to FIG. 3D and to operation 414 in FIG. 4, when a molecular beam is used to activate the surface reaction, the beam may include ions, free-radicals, and neutral non-radical species, and exposure of the adsorption-limited layer to such species may serve to activate the surface reaction. If ionized species are used to activate the reaction, they may be plasma-generated. The plasma may be formed from/comprise an inert gas such as He, Ar, Ne, Kr, and/or Xe. Ions of the plasma may be directed by an applied electromagnetic field so as to travel (and contact the substrate) with a velocity substantially perpendicular to the plane of the substrate. Of course, such an applied electromagnetic field may also accelerate the ions to a particularly desired kinetic energy level. Though this may resemble an ion-based sputter etch technique, the difference here is that the energy transferred by the impinging ions need only be sufficient to activate the surface reaction of the adsorbed cleaning species, rather than sufficient to collision-ally ablate the contaminants from the surface from sheer kinetic energy alone. Thus, for example, in the ALC techniques disclosed herein, the ion species may contact the adsorption-limited layer (as in FIG. 3D) by impacting it with a relative kinetic energy of less than 100 eVs, or a relative kinetic energy of less than 30 eVs, or even less than 10 eVs. Of course, if free-radical species are used to activate the reaction, these are oftentimes plasma-generated as well, and also typically have a lower kinetic energy. In any event, because the impinging molecular beam used to activate the surface reaction imparts much less energy to the underlying substrate than an ion-based sputter etch, the atomic layer clean (ALC) technique has the potential to be far less damaging to the underlying surface.

As just described, in some embodiments, the surface reaction between the adsorbed cleaning species and contaminants on the contact surface may be plasma-activated. Thus, the low energy molecular beam schematically illustrated in FIG. 3D may be created by generating a plasma in the processing chamber, or by introducing a remotely-generated plasma into the processing chamber, or by a combination of the foregoing, etc. Typically, if ions are used to activate the surface reaction, an ion-based plasma is generated within the processing chamber. If free-radical species are used to activate the surface reaction, they may be introduced into the processing chamber from a free-radical-based plasma generated remotely from the processing chamber—i.e., from a remote free-radical-based plasma source. In some embodiments, the plasma may contain a substantial number of both free-radical species and ionic species. In some embodiments, the plasma may be an argon-based ionized plasma, albeit—as described above—typically with ions having a mean kinetic energy substantially less than what would be used in a standard Ar-plasma-based surface etch technique.

In some embodiments, a plasma comprising hydrogen and argon may be used and hydrogen free-radicals and ions, as well as argon ions may contact the adsorbed cleaning species to activate the surface reaction. In some embodiments, the plasma used to activate the surface reaction between the adsorbed cleaning species and the contaminants on the contact surface may substantially constitute a hydrogen plasma, or it may substantially constitute an argon plasma, or the plasma may constitute a combination of an argon plasma and a hydrogen plasma. In some embodiments, plasma-activation may comprise first exposing the adsorbed cleaning species to a plasma substantially constituting a hydrogen plasma and, second, exposing the adsorbed cleaning species to a plasma substantially constituting an argon plasma. Or, in other embodiments, this order may be reversed: argon plasma exposure first, followed second, by hydrogen plasma exposure. Depending on the embodiment, one or more of these plasmas may be generated directly in the processing chamber, or one or more of these plasmas may be remote plasmas generated remotely from the processing chamber and subsequently introduced into the processing chamber. In some embodiments, one or more plasmas may be provided by a combination of in-chamber plasma generation and remote plasma generation. In any event, exposure of the adsorption-limited layer of cleaning species to either ions and/or free-radical species present in one or more plasmas (and in some embodiments directed by an applied electromagnetic field) results in a reaction which removes contaminants from the surface of the electrical contact as also shown in FIG. 3D.

Note that the adsorbed layer of cleaning species may oftentimes be described as a conformal layer—i.e., having a substantially uniform thickness and which substantially conforms to the shape of the features onto which it is adsorbed. And, since the thickness of the adsorbed layer is substantially uniform, the amount of reactive cleaning species to which any portion of the substrate is exposed during the reactive process is substantially controllable, selective, and predictable.

Plasma activation of the adsorbed cleaning species may act as an additional mechanism for controlling the specificity of the cleaning process. In particular, an applied electromagnetic field (EM) may be used to direct the flux of one or more species of the plasma towards the base/bottom of the electrical contact feature (as shown in FIG. 3D). If in so doing, the impinging species is directed so as to travel in a direction substantially perpendicular to the plane of the substrate, the impinging species will collide with much less frequently with a feature's sidewalls than with it's base/bottom and hence the cleaning reaction will be preferentially activated at the base of the feature rather than on the sidewalls thereby working to preserve the CD and AR of the feature.

Note that the applied EM field may generate a constant flux of impacting species, or it may generate pulses of impacting species through pulsation of the EM field. In some embodiments, ions may be directed by the EM field to impact the adsorbed cleaning species with a kinetic energy below the sputter threshold of the impacted material. In the energy regime below the sputter threshold, the impacting particles have sufficient energy to activate a reaction of the adsorbed cleaning species, but not enough energy to remove material via an ion or ion-assisted etch process. Thus, in order to ensure that contaminant removal occurs via an activated chemical cleaning process rather than an ion or ion-assisted etch process, ions may be directed by an applied EM field such that they impact the adsorbed cleaning species with a kinetic energy of less than 100 electron volts (eVs), or in certain such embodiments, with a kinetic energy of less than 30 eVs, or even yet more particularly, of less than 10 eVs. Depending on the embodiment, the ion species comprising the plasma may be hydrogen ions, and/or ions of an inert gas such as argon, for example.

As indicated above, the cleaning species may be a fluorine-containing species, like $C_4F_8$. In some embodiments, the fluorine-containing species may be a carbon-free fluorine-containing species such as $XeF_2$, $BrF_3$, $IF_5$, or $ClF_3$. It should be noted that many, or most, if not all contact contaminants deposited in typical reactive ion etch (RIE, see above) processes are removable by fluorine—either in atomic form, ionized or acid form, or as when serving as a functional group of a more complex chemical species. In particular, fluorine may be used to remove interfacial species often deposited during reactive ion etching, whereas chlorine generally does not work to remove such species. However, it is also true that fluorine can react with the surface of a metal substrate to generate metal fluorides which themselves may represent an undesirable residue on the surface of an electrical contact.

Fortunately, metal fluorides may be reduced and oftentimes removed from the surface of an electrical contact by hydrogen ion and/or free-radical species:

$$MF_n + n\ H^* \rightarrow M + n\ HF(\uparrow)$$

where ($\uparrow$) indicates that the species may be removed from the processing chamber (by purging, pumping down to a base pressure, etc.) once the metal fluoride has been reacted away. In some embodiments, these hydrogen species are already present in the plasma used to activate the ALD-like cleaning reaction (ALC) just described. In addition, metal oxides and silicates (which may be present on the contact surface having formed there in the RIE used to open the contact surface, for example) may also be removed by hydrogen ions and/or free radicals:

$$MO_n + 2n\ H^* \rightarrow M + n\ H_2O(\uparrow)$$

Accordingly, in some embodiments, as the ALC phase of a contact cleaning process concludes—e.g., as adsorbed cleaning species is reacted away via plasma-activation such that adsorbed cleaning species is no longer present over certain portions (or all) of the contact surface—the plasma may be maintained such that some or all of any remaining contaminants still present on the contact surface may be reacted with the hydrogen ion and/or free-radicals of the plasma. This plasma contact step may then result in the removal of at least a portion of any remaining metal fluorides and metal oxides, as well as metal silicates and/or other contaminants which may still be present on the contact surface as the cleaning species is reacted away. In some embodiments, a pre-ALC plasma contact step may also be employed. Thus, for example, prior to formation of an adsorption-limited layer of cleaning species as described above, the surface of the electrical contact interface may be treated with a pre-treatment plasma. This pre-treatment plasma may be the same or different than the plasma applied to remove metal-fluoride residues after the ALC.

It is also noted that for a silicon substrate, the above-described adsorption, and subsequent plasma-activation and reaction of a fluorine-containing cleaning species may, in some embodiments, lead to loss of silicon from the substrate surface due to the formation of silicon-fluorine compounds (e.g., $SiF_x$). However, due to the adsorption-limited nature of an ALD-like process—e.g., that the adsorption-limited layer of fluorine-containing cleaning-species has a substantially uniform thickness—the amount of substrate which is etched away may be controlled, such that substrate material removal is reduced relative to other material removal techniques, or minimized, for example to within 10-30 Angstroms. Thus, the foregoing described cleaning methodologies are able to controllably remove undesirable contaminants from an electrical contact surface without damaging it or substantially altering is critical dimension (CD) prior to subsequent contact metallization.

Finally, it is noted that any of the foregoing described cleaning techniques, processes, methodologies, etc. may be employed as part of a method of forming a metallization layer atop an electrical contact interface of a partially fabricated semiconductor substrate. Thus, for example, a method of forming a metallization layer may include removing contaminants from an electrical contact interface according to any of the atomic layer cleaning (ALC) methods or processes described above, and thereafter depositing a metallization layer atop the electrical contact interface. Stated another way, the cleaning procedures illustrated in FIGS. 3 and 4 may be used to replace the ion etch cleaning methodology shown in the metallization procedure of FIG. 2 resulting in an improved metallization procedure employing an ALC. It is additionally noted that, in some methodologies, contact cleaning and contact metallization may be performed in the same processing chamber (such process chambers are described below), and moreover, in some embodiments, deposition of the metallization layer may follow the cleaning operation (though not necessarily immediately) without breaking vacuum. This may help to reduce or eliminate the formation of contaminants on the electrical contact surface (such as those caused by oxidation from atmospheric exposure) during any intervening period. Furthermore, it is noted that the foregoing described cleaning techniques, processes, methodologies, etc. may be employed to remove contaminants from electrical contact surfaces formed on a variety of different semiconductor substrate types including, but not limited to: Si, Ge, SiGe, InP, GaAs, Ge, InAs, InSb, and graphene substrates, as well as from metal silicide layers formed on such surfaces (e.g., the nickel silicide layer on silicon substrate described above).

Apparatuses

The cleaning methods presented herein may be carried out in various types of deposition apparatuses available from various vendors. These apparatuses may be used for forming metallization layers atop, and in electrical contact with, the electrical contact interfaces of partially fabricated semiconductor substrates. For certain such apparatuses, the cleaning processes and methodologies disclosed herein may be performed in the same processing chambers which are used for depositing substrate metallization layers. Moreover, in certain such embodiments, metallization layer deposition may follow a residual removal process without an intervening vacuum break which, as indicated above, may help to prevent the formation of additional contaminants during the intervening period between contact cleaning and contact metallization. As these components are described in detail below, such an apparatus may include a processing chamber having a substrate holder within it, one or more gas inlets for introducing chemical species into the processing chamber, and an exhaust system for evacuating chemical species from the processing chamber. In certain embodiments, the apparatus may further include a plasma generator for generating a plasma within the processing chamber.

Also included in such apparatuses may be a controller configured to execute machine-readable instructions for cleaning the electrical contact interface and subsequently depositing the metallization layer. The instructions for cleaning the electrical contact interface may implement an atomic layer clean (ALC) operation (as well as a pre-ALC plasma exposure pre-treatment), as described above. Thus, in some embodiments, the executable machine-readable instructions may include instructions for operating one or more gas inlets to introduce a cleaning species (e.g., a halogen-containing species such as a fluorine-containing species) into a processing chamber, and for maintaining conditions within the processing chamber such that an adsorption-limited layer comprising the cleaning species forms atop the electrical contact interface and/or contaminants present thereon (as described in detail above). The executable machine-readable instructions may further include instructions for removing un-adsorbed cleaning species (e.g., halogen-containing species such as fluorine-containing species) from the processing chamber (as also described in detail above). And, the executable machine-readable instructions may further include instructions for activating a reaction between the adsorbed cleaning species and the contaminants present on the electrical contact interface. In certain such embodiments, the instructions for activating the reaction may include instructions for operating a plasma generator to generate a plasma within the processing chamber and thereby expose the adsorption limited layer to an ion and/or free-radical species present in the plasma. In any event, the activated surface reaction results in the removal of at least a portion of the contaminants from the electrical contact interface as described in detail above. In some embodiments, It is also important to ensure that the processing chamber is substantially free of any $O_2$, $H_2O$, and/or other oxidizing species so that there is minimal re-oxidation of the substrate (Si, SiGe, Ge, NiSi, and others) during the plasma activation step. Depending on the embodiments, the instructions of the controller may further provide that the foregoing instructions be executed without an intervening vacuum break.

Some examples of suitable apparatuses may include a Novellus Concept-1 ALTUS™, a Concept 2 ALTUS™, a Concept-2 ALTUS-S™, Concept 3 ALTUS™ deposition system, and ALTUS Max™ or any of a variety of other commercially available CVD tools. In some cases, the process can be performed on multiple deposition stations sequentially. A description of such multi-station operation can be found in, for example, U.S. Pat. No. 6,143,082, which is incorporated herein by reference for the purpose of describing multi-station architecture and operation suitable for implementation of embodiments of the present invention.

In some embodiments, each of the cleaning and metal deposition processes occurring at different steps may be performed in a single chamber, or within a single chamber having multiple deposition stations, or within multiple chambers of an integrated process tool. When a single chamber is utilized, such an arrangement can avoid having to introduce an intervening vacuum break or otherwise transfer the substrate to another chamber or process tool.

In some embodiments, gases relevant to a cleaning operation can be first introduced to the surface of the substrate at a first station. Then a second station may be used to complete another phase of the metallization process, such as, for example, depositing tungsten. In such embodiments, a tungsten-containing precursor and hydrogen gas at a high partial pressure are introduced to the surface of the feature using an individual gas supply system that creates a localized atmosphere at the substrate surface. Alternatively, the cleaning operation as well as the metal deposition process can occur in the same chamber or same station, and the apparatus may be configured to change the relevant chemical species introduced into the chamber or station.

In some embodiments, where a plasma treatment step occurs before the contact clean operation, an inert gas containing plasma, corresponding carrier gases, and other gases are introduced to the surface of the substrate at a first station. Then the substrate may be optionally transferred to another station or chamber to complete the contact clean and metallization process. For example, to complete a tungsten-metallization process, a tungsten-containing precursor, hydrogen gas, and potentially other carrier gases may be introduced to the surface of the feature possibly using an individual gas supply system that creates a localized atmosphere at the substrate surface.

In some embodiments, a downstream plasma apparatus including a plasma generator may be used. A showerhead or other gas inlet can separate the plasma generator and an exposure area of a treatment chamber. Sources of gas provide a flow of gas into the plasma generator. In some embodiments, the plasma generator includes induction coils connected to a power source. During operation, gas mixtures are introduced into the plasma generator, with induction coils energized, and plasma is generated in the plasma generator. In embodiments in which a showerhead assembly is used, the assembly may have an applied voltage. The assembly may terminate the flow of some or substantially all ions and allow the flow of neutral species such as radicals into the treatment chamber. In some embodiments, the plasma is created by flowing gas through an inductively coupled source. An example of this type of remote plasma source is the Astron®, manufactured by MKS Instruments of Wilmington, Mass. Reactive species can be produced within the plasma and transported to a chamber which contains the substrate. In some embodiments, ionic species are not introduced from the remote plasma source.

In some embodiments, each cleaning and metal deposition process may be performed in one of two, four, five, or even more stations positioned within a single chamber or apparatus. Process gases for each of the cleaning and metal deposition processes may be introduced to the surface of the substrate at a station using an individual gas supply system that creates a localized atmosphere at the substrate surface.

Figure 5:
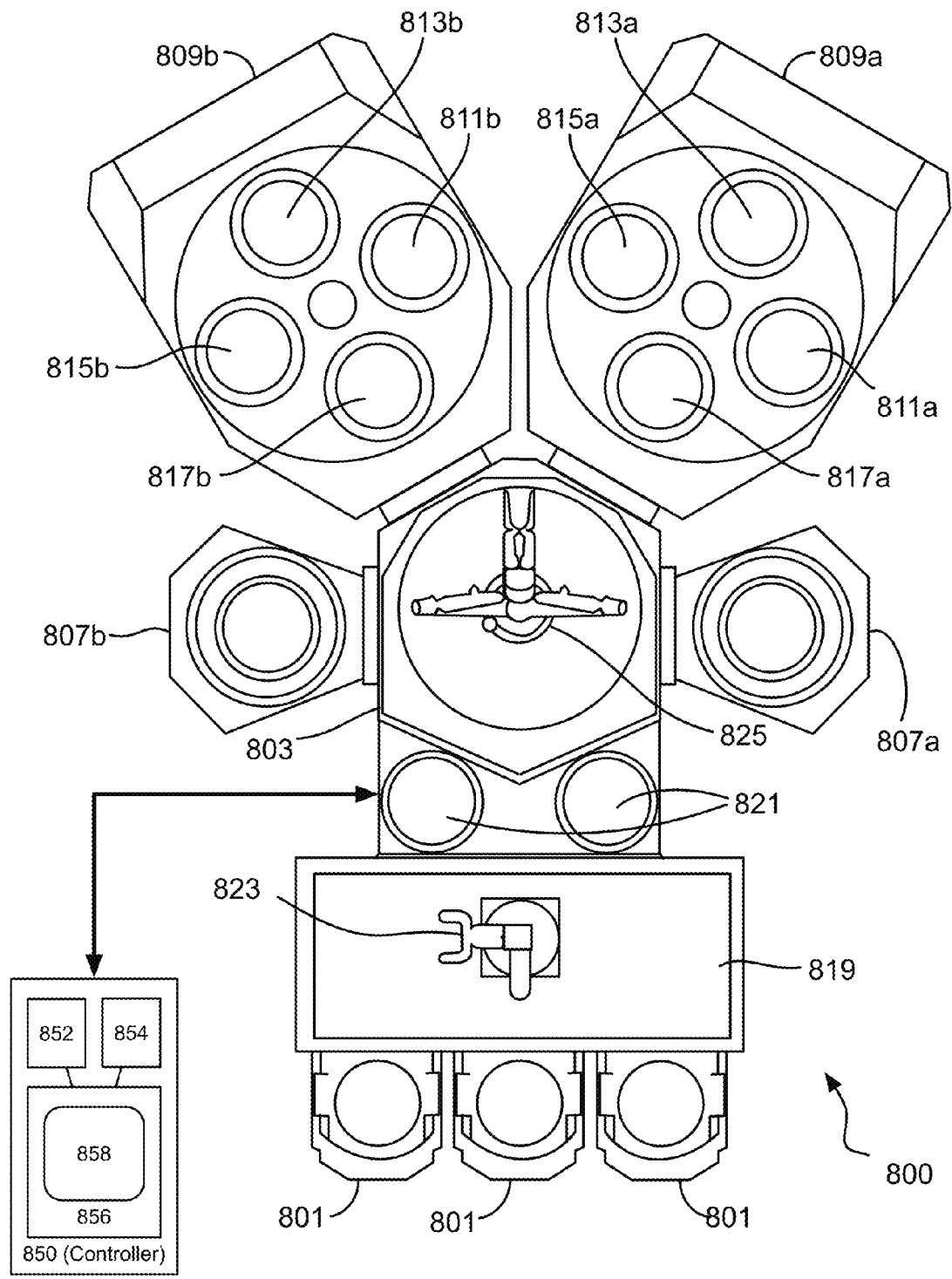
FIG. 5 shows a block diagram for a multi-deposition station processing system for manufacturing an electrical interconnect structure of a semiconductor device.

FIG. 5 shows a top view schematic of a processing system 800 for manufacturing an interconnect structure of a semiconductor device. In FIG. 5, a block diagram for a processing system 800 with multiple deposition stations may be configured to perform multiple processes. Some of the contact cleaning and metallization operations may be performed without a vacuum break. In some embodiments, the processing system is an integrated processing tool.

Figure 6:
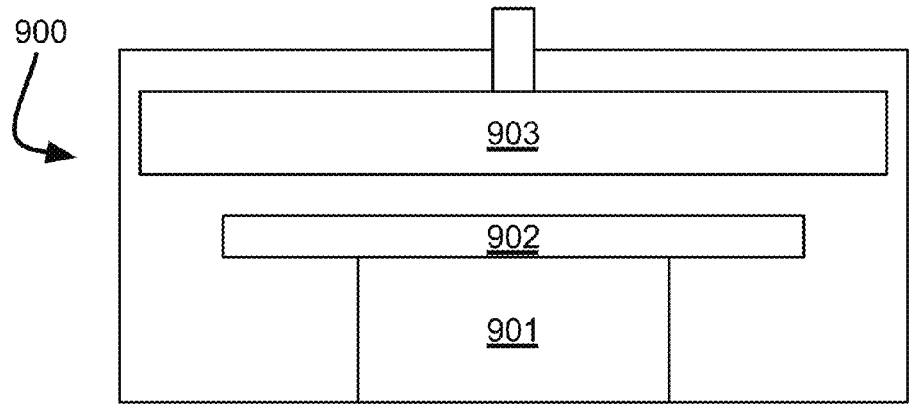
FIG. 6 shows a deposition station from the multi-deposition station processing system of FIG. 5 including a wafer support and showerhead.

The processing system 800 includes a transfer module 803. The transfer module 803 provides a clean, reduced pressure environment to minimize the risk of contamination (due to oxygen, water vapor, $CO_2$, and other contaminating and/or oxidizing gases) of substrates being processed as they are moved between the various reactor modules. Mounted on the transfer module 803 is a multi-station chamber 809 capable of performing substrate cleaning (e.g., ALC operations), plasma treatment, barrier layer deposition if desired, and metal deposition, according to some embodiments. Chambers 809a and 809b may include multiple stations 811a, 813a, 815a, 817a, 811b, 813b, 813c, and 813d that may sequentially perform these operations. For example, chamber 809a could be configured such that station 811a performs cleaning, station 813a performs barrier layer deposition, and stations 815a and 817a perform metal deposition, such as tungsten-metallization. Each deposition station may include a heated substrate pedestal and a showerhead, dispersion plate or other gas inlet. An example of a deposition station 900 is depicted in FIG. 6, including wafer support 902 and showerhead 903. A heater may be provided in pedestal portion 901.

Also or alternatively mounted on the transfer module 803 may be one or more single or multi-station modules 807a or 807b capable of performing a cleaning operation. The module 807a or 807b may also be used for various other treatments, e.g., WN or other barrier/liner layer deposition, or metallization, e.g. W-metallization. The processing system 800 also includes one or more (in this case, three) substrate source modules 801 where substrates are stored before and after processing. An atmospheric robot 823 in the atmospheric transfer chamber 819 first removes substrates from the source modules 801 to load locks 821. A substrate transfer device 825, such as a robot arm unit, in the transfer module 803 moves the substrates from the load locks 821 to and among the modules 807a and 807b mounted on the transfer module 803. Thus, the processing system 800 may perform the aforementioned processes, including contact cleaning and metallization (e.g., by CVD of the metal), in the same tool without introducing a vacuum break.

In certain embodiments, a system controller 850 is employed to control process conditions during deposition. The controller 850 will typically include one or more memory devices 852, 854 and one or more processors 856. The processor may include a CPU or computer 858, analog and/or digital input/output connections, stepper motor controller boards, etc.

The controller 850 may control all of the activities of the deposition apparatus 800. The system controller executes system control software including instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions, such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of some embodiments in a single or multi-chamber semiconductor processing tool.

The controller 850 may be configured with instructions for performing the operations described earlier herein. These instructions may include instructions for conducting contact clean and contact metallization operations described herein.

EXAMPLE

Figure 7:
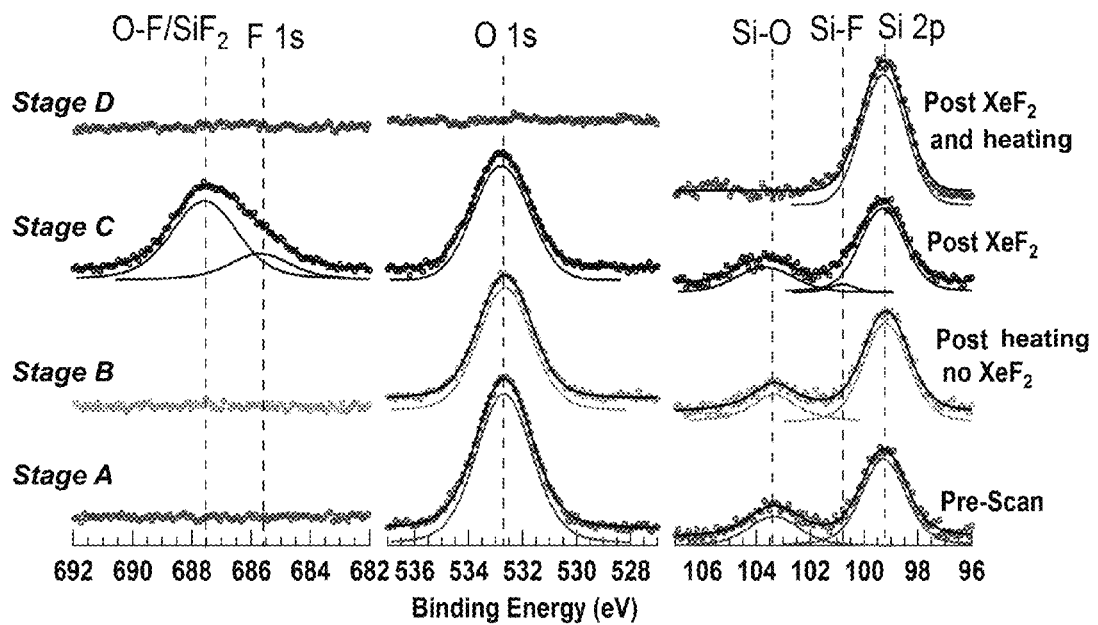
FIG. 7 shows several x-ray photoelectron spectra illustrating the thermally activated desorption of fluorine and oxide form the surface of a semiconductor substrate.

FIG. 7 provides an example of thermally activating a surface reaction of adsorbed fluorine with oxide species present on the surface of a semiconductor substrate. Specifically, the figure shows several x-ray photoelectron spectra (XPS) which reveal the chemical composition of the substrate surface at the four stages of the experiment (labeled 'A, 'B,' 'C,' and 'D' in FIG. 7). Stage A is the control, and the XPS spectra show that the surface composition includes oxygen and silicon. Next, the substrate is heated in stage B, and the XPS spectra show that there is essentially no change in the surface composition. $XeF_2$ is introduced in stage C, and the XPS spectra now show that fluorine has been adsorbed onto the substrate surface. Finally, at stage D, temperature is ramped a second time, and it is seen that the oxygen and fluorine peaks are now absent from the XPS spectra indicating that in addition to fluorine being desorbed from the substrate surface, oxygen has also now been removed, leaving un-oxidized silicon. In short, the experiment illustrates thermal activation of a surface reaction involving fluorine does result in oxygen removal. Note that while this experiment illustrates that plasma activation is not required to achieve a surface reaction involving an adsorption-limited layer of fluorine, plasma activation is still sometimes preferred, particularly in situations where it is desired to minimize the thermal exposure of a partially fabricated semiconductor substrate.

Tungsten Deposition

As described above, various metallization procedures may employ one or more operations of tungsten deposition. In some embodiments, the tungsten deposition may be described as substantially conformal and may be accomplished via a reaction between a tungsten-containing species and a reducing agent such as molecular hydrogen. In certain such embodiments, the tungsten is deposited atop a barrier layer (e.g., of elemental titanium or titanium nitride) after it has been clean with an atomic layer cleaning technique as discussed above.

The barrier layer, also referred to below as an "underlayer" for tungsten deposition, may also serve as a nucleation layer for tungsten deposition. Since tungsten deposition generally does not occur on bare or oxidized silicon in the thermodynamic regimes relevant to semiconductor fabrication, some sort of underlayer for nucleation is generally necessary, as stated above. Generally, this layer may include one or more types of metal nitrides and, in some embodiments, titanium nitride (TiN) and/or tungsten nitride (WN) and/or others. The layer may be between about 10 Å and 500 Å (Angstroms) thick or, in more specific embodiments, between about 25 Å and 200 Å thick.

The underlayer (or barrier layer) used for tungsten nucleation is typically a thin conformal layer that facilitates subsequent deposition of bulk tungsten-containing material thereon. In certain embodiments, the nucleation layer is deposited using a pulsed nucleation layer (PNL) technique. In a PNL technique, pulses of the reducing agent (e.g., molecular hydrogen) and a tungsten-containing species are sequentially injected into and purged (via a injected pulse of purge gas) from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. patent application Ser. No. 12/030,645 filed on Feb. 13, 2008, U.S. patent application Ser. No. 11/951,236, filed Dec. 5, 2007, and U.S. patent application Ser. No. 12/407,541, filed on Mar. 19, 2009, each of which are hereby incorporated by reference in their entirety for all purposes. Additional discussion regarding PNL type processes can be found in U.S. Pat. Nos. 6,635,965, 6,844,258, 7,005,372 and 7,141,494 as well as in U.S. patent application Ser. No. 11/265,531, each of which are also hereby incorporated by reference in their entirety for all purposes. The methods described herein are not limited to a particular method of tungsten nucleation layer deposition, but include deposition of bulk tungsten film on tungsten nucleation layers formed by any method including PNL, ALD, CVD, PVD and any other method. Moreover, in certain embodiments, bulk tungsten may be deposited directly without use of a nucleation layer.

A deposition station may be used to deposit tungsten but also used to perform certain prior operations (e.g., deposition of a diffusion barrier layer, deposition of a nucleation layer) and/or subsequent operations (e.g., etching of deposited tungsten, another tungsten deposition, final feature filling).

In some embodiments, tungsten deposition involves a chemical vapor deposition (CVD) process in which a tungsten-containing species is introduced into the processing chamber and subsequently reduced by hydrogen to deposit tungsten. While tungsten hexafluoride ($WF_6$) is one tungsten-containing species which is often used, the process may be performed with other tungsten-containing species, including, but not limited to, tungsten hexachloride ($WCl_6$), organometallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten). In addition, while hydrogen is generally used as the reducing agent in the CVD deposition of the bulk tungsten layer, other reducing agents including silane may be used in addition or instead of hydrogen without departing from the scope of the invention. In another embodiment, tungsten hexacarbonyl ($W(CO)_6$) may be used with or without a reducing agent. Unlike with the PNL processes described above, in a CVD technique, the $WF_6$ and $H_2$ or other reactants are simultaneously introduced into the reaction chamber. This produces a continuous chemical reaction of mix reactant gases that continuously forms tungsten film on the substrate surface. Methods of depositing tungsten films using chemical vapor deposition (CVD) are described in U.S. patent application Ser. No. 12/202,126 filed Aug. 29, 2008, which is hereby incorporated by reference in its entirety for the purposes of describing deposition processes. According to various embodiments, the methods described herein are not limited to a particular method of partially filling a feature but may include any appropriate deposition technique. Further details relating to methods of depositing tungsten onto partially manufactured semiconductor substrates may be found in U.S. Pat. No. 8,124,531 which is hereby incorporated by reference in its entirely for all purposes.

Photolithography

The apparatus/process described herein above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although the foregoing disclosed processes, methods, systems, apparatuses, and compositions have been described in detail within the context of specific embodiments for the purpose of promoting clarity and understanding, it will be apparent to one of ordinary skill in the art that there are many alternative ways of implementing these processes, methods, systems, apparatuses, and compositions which are within the spirit of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

The invention claimed is:

1. A cleaning method for removing contaminants from an electrical contact interface of a partially fabricated semiconductor substrate in a processing chamber, the contact interface for making an electrical connection with a metal, the method comprising:

(a) introducing a halogen-containing species into the processing chamber;
(b) forming an adsorption-limited layer atop the electrical contact interface and/or contaminants thereon, the adsorption-limited layer comprising halogen from the halogen-containing species;
(c) after (b), removing un-adsorbed halogen-containing species from the processing chamber; and
(d) activating a reaction between the halogen of the adsorption-limited layer and the contaminants present on the electrical contact interface, the reaction resulting in the removal of at least a portion of the contaminants from the electrical contact interface wherein the contaminants comprise one or more fluorocarbon polymer species deposited in a prior fabrication operation involving a reactive ion etch of the partially-manufactured semiconductor substrate.

2. The method of claim 1, wherein activating the reaction in (d) comprises reacting an additional chemical species with the halogen and/or halogen-containing species of the adsorption-limited layer.

3. The method of claim 1, wherein activating the reaction in (d) comprises providing thermal energy to the adsorption-limited layer.

4. The method of claim 1, wherein activating the reaction in (d) comprises exposing the adsorption-limited layer to an ion and/or free-radical species of a plasma.

5. The method of claim 4, wherein activating the reaction in (d) further comprises directing an ion species of the plasma toward the adsorption-limited layer by applying an electromagnetic field to the ion species such that it contacts the adsorption-limited layer.

6. The method of claim 5, wherein application of the electromagnetic field to the ion species causes it to contact the adsorption-limited layer while having a velocity substantially perpendicular to the plane of the semiconductor substrate.

7. The method of claim 5, wherein the ion species contacts the adsorption-limited layer by impacting it with a relative kinetic energy of less than 100 eVs.

8. The method of Claim 4, further comprising:
(f) after (d), reacting metal fluorides and/or metal oxides present on the electrical contact interface with the ion and/or free-radical species present in the plasma, the reaction resulting in the removal of at least a portion of the metal fluorides and/or metal oxides from the electrical contact interface.

9. The method of claim 1, further comprising:
(e) removing halogen-containing species generated by the reaction in (d) from the processing chamber.

10. The method of claim 1, wherein the halogen-containing species introduced in (a) is an interhalogen selected from the group consisting of:
$XeF_2$, $BrF_3$, $IF_5$, and $ClF_3$.

11. The method of claim 1, wherein the electrical contact interface comprises Si, Ge, and/or GaAs.

12. The method of claim 11, wherein the electrical contact interface comprises SiGe.

13. The method of claim 11, wherein the electrical contact interface comprises Si and further comprises a metal silicide layer atop at least some portion of the underlying Si.

14. The method of claim 13, wherein the metal silicide layer comprises Ni silicide, Ti silicide, and/or Co silicide.

15. The method of claim 11, wherein the electrical contact interface comprises Ge and further comprises a metal germanide layer atop at least some portion of the underlying Ge.

16. The method of claim 15, wherein the metal germanide layer comprises Ti germanide, Ni gemanide, and/or Co germanide.

17. The method of claim 1, wherein the halogen is fluorine.

* * * * *